United States Patent
Ohnishi et al.

(10) Patent No.: US 7,408,405 B2
(45) Date of Patent: Aug. 5, 2008

(54) HIGH-FREQUENCY POWER AMPLIFIER MODULE

(75) Inventors: Masami Ohnishi, Hachioji (JP); Tomonori Tanoue, Machida (JP); Hidetoshi Matsumoto, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 86 days.

(21) Appl. No.: 11/182,859

(22) Filed: Jul. 18, 2005

(65) Prior Publication Data

US 2006/0061417 A1 Mar. 23, 2006

(30) Foreign Application Priority Data

Sep. 21, 2004 (JP) .............................. 2004-272945

(51) Int. Cl.
 H03F 1/14 (2006.01)
 H03F 3/191 (2006.01)
(52) U.S. Cl. ........................................ 330/51; 330/302
(58) Field of Classification Search .................. 330/51, 330/124 R, 286, 295, 302
 See application file for complete search history.

(56) References Cited

U.S. PATENT DOCUMENTS

| | | | |
|---|---|---|---|
| 5,548,246 A | 8/1996 | Yamamoto et al. ............. 330/51 |
| 6,114,911 A * | 9/2000 | Iwai et al. ..................... 330/295 |
| 6,674,323 B2 | 1/2004 | Kagaya et al. ................. 330/51 |
| 6,765,439 B2 * | 7/2004 | Choi ........................ 330/124 R |
| 6,853,243 B2 | 2/2005 | Sekine et al. .................. 330/51 |
| 7,123,096 B2 * | 10/2006 | Selin ........................... 330/295 |
| 2003/0025555 A1 | 2/2003 | Ohnishi et al. ............... 330/124 |

FOREIGN PATENT DOCUMENTS

| | | |
|---|---|---|
| JP | 07-336168 | 12/1995 |
| JP | 2003-046340 | 2/2003 |
| JP | 2003-087059 | 3/2003 |
| JP | 2003-087060 | 3/2003 |

* cited by examiner

*Primary Examiner*—Khanh V Nguyen
(74) *Attorney, Agent, or Firm*—Miles & Stockbridge P.C.

(57) ABSTRACT

For use in an amplifier configuration including a high-power amplifier and a low-power amplifier which are always interconnected in terms of high frequencies and between which switching is made using no switches, a highly stable high-frequency power amplifier module with high isolation between the amplifiers is provided. To reduce wrapping around from a low-power amplifier section in an activated state to a high-power amplifier section in a deactivated state or from the high-power amplifier section in an activated state to the low-power amplifier section in a deactivated state, an input matching circuit having high isolation characteristics is included in an input matching circuit portion which does not have much to do with amplifier efficiency. Switching of each of the amplifier sections between an activated state and a deactivated state is effected by control using bias input terminals.

16 Claims, 6 Drawing Sheets

HIGH-FREQUENCY POWER AMPLIFIER MODULE

CLAIM OF PRIORITY

The present application claims priority from Japanese application JP 2004-272945 filed on Sep. 21, 2004, the content of which is hereby incorporated by reference into application.

FIELD OF THE INVENTION

The present invention relates to a high-frequency power amplifier for use in a transmitter section of radio communication equipment such as mobile telephones. More particularly, it relates to a high-frequency power amplifier module in which switching between a high-power amplifier and a low-power amplifier can be made by bias control.

BACKGROUND OF THE INVENTION

In recent years, in the field of mobile communications, not only mobile terminals but also base stations are required to be made smaller and lighter. In this respect, since the power amplifier sections of relevant equipment greatly affect the sizes and weights of the equipment, it is important to improve efficiency of the power amplifier sections. Mobile terminals, in particular, are normally powered by batteries, so that the length of time during which they are continuously operable is limited. In the circuit of a mobile terminal, its power amplifier section consumes the most power. Reducing the power consumption of the power amplifier section (that is, making the power amplifier section more efficient) is therefore a major task to be solved to make the mobile terminal continuously operable for an extended period of time. For a base station, too, to allow its equipment to be installed close to an antenna so as to reduce cable loss, making its high-frequency power amplifier section smaller and lighter is required. Hence, improving efficiency of the high-frequency power amplifier section is essential.

Generally, the efficiency of a high-frequency power amplifier using a semiconductor device increases with its output level, achieving maximum efficiency around where the output is saturated. The maximum output (saturation power) level obtainable from a high-frequency power amplifier depends on the size of a semiconductor device used in it. If, to improve the efficiency in a low output power range of a high-frequency power amplifier, the semiconductor device included in the high-frequency power amplifier is made smaller, causing its output saturation level to be lowered, the high-frequency power amplifier will become unable to provide a high output power when required. If a high-frequency power amplifier is arranged to render high efficiency in a high output power range, its efficiency will remarkably deteriorate in a low output power range. Thus, it is extremely difficult to make a high-frequency power amplifier highly efficient both in a high output power range and in a low output power range.

A known arrangement for achieving highly efficient operation both in a high output power range and in a low output power range includes plural output stage amplifiers and switches. In the arrangement, the switches are used to selectively use the amplifiers according to the required output level (see the patent document 1, for example).

In another known arrangement intended to further improve efficiency, switching between plural output stage amplifiers is effected using no switches (see the patent document 2, for example).

[Patent Document 1] JP-A No. 07-336168
[Patent Document 2] JP-A No. 2003-046340

SUMMARY OF THE INVENTION

In the known arrangement in which switches are used to selectively use plural output stage amplifiers, the switches contribute to lowering the efficiency of operation, but isolation between the output stage amplifiers connected in parallel is enhanced. In the another known arrangement in which output stage amplifiers are selectively used using no switches, lowering of the operational efficiency due to switches does not take place, but, with high-power amplifiers and low-power amplifiers always interconnected in terms of high frequencies, isolation between the amplifiers is low and the amplifiers are less stable.

An object of the present invention is to provide a highly stable high-frequency power amplifier module with high isolation between output amplifiers.

Of the inventions disclosed in the present specification, the representative invention can be described as follows. A high-frequency power amplifier module according to the present invention includes a first amplifier section which power amplifies a high-frequency signal, a second amplifier section which power amplifies a high-frequency signal, an input matching circuit which makes input matching between the first amplifier section and the second amplifier section, and an output matching circuit which makes output matching between the first amplifier section and the second amplifier section, wherein operations of the first and the second amplifier sections are switched by control using a bias voltage or a bias current and wherein the input matching circuit has a high isolation characteristic between the first and the second amplifier sections.

DETAILED DESCRIPTION OF THE PREFERRED EMBODIMENTS

Figure 1:
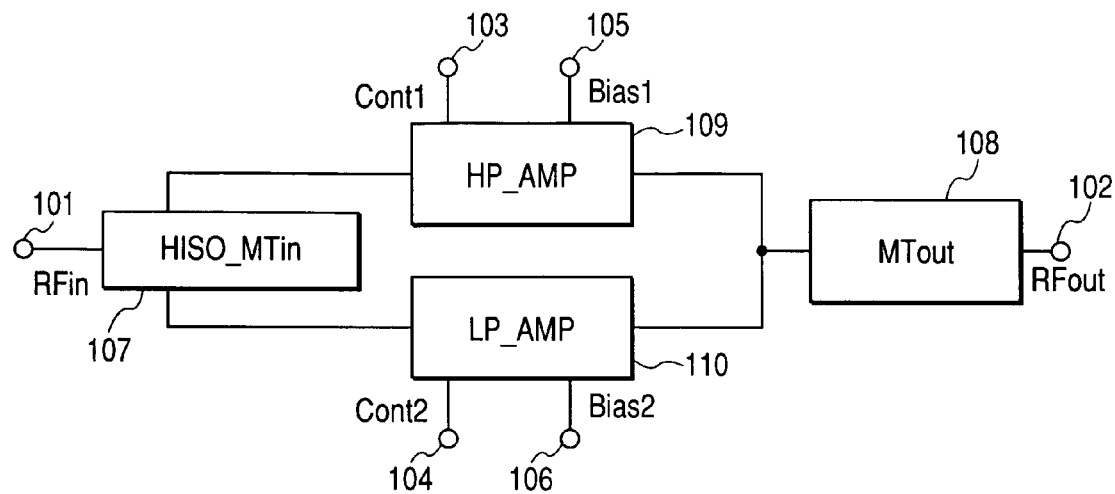
FIG. 1 is a circuit block diagram showing a configuration of a high-frequency power amplifier module according to the present invention.

Hereinafter, preferred embodiments of a high-frequency power amplifier module according to the present invention will be described in detail with reference to the accompanying drawings. In the following description of the embodiments, the same components are denoted by the same reference numerals or symbols and their detailed explanations are not repeated.

Embodiment 1

FIG. 1 is a circuit block diagram showing a configuration of a high-frequency power amplifier module according to the present invention. A high-frequency power is input to a high-frequency input (RFin) terminal 101 and is transmitted, via a high-isolation, input matching circuit (HISO_MTin) 107, to a high-power amplifier section (HP_AMP) 109 or a low-power amplifier section (LP_AMP) 110 to be amplified there. The amplified high-frequency power is then output, after passing an output matching circuit (MTout) 108, from a high-frequency output (RFout) terminal 102. The high-isolation input matching circuit may be, for example, a Wilkinson divider.

Activating the low-power amplifier section 110 and deactivating the high-power amplifier section 109 of the high-frequency power amplifier module is possible by turning off either or both of a bias input terminal (Cont1) 103 and a bias output terminal (Bias1) 105 of the high-power amplifier section 109 and turning on both of a bias input terminal (Cont2) 104 and a bias output terminal (Bias2) 106 of the low-power amplifier section 110.

Activating the high-power amplifier section 109 and deactivating the low-power amplifier section 110 of the high-frequency power amplifier module is possible, in a manner similar to the above-described, by turning off either or both of the input side bias terminal 104 and the output side bias terminal 106 of the low-power amplifier section 110 and turning on both of the input side bias terminal 103 and the output side bias terminal 105 of the high-power amplifier section 109.

Providing a high-isolation input matching circuit as in the present embodiment can prevent, using no switches, a signal from wrapping around from an activated amplifier section to a deactivated amplifier section, so that a highly stable and efficient high-frequency power amplifier module can be realized.

Figure 7:
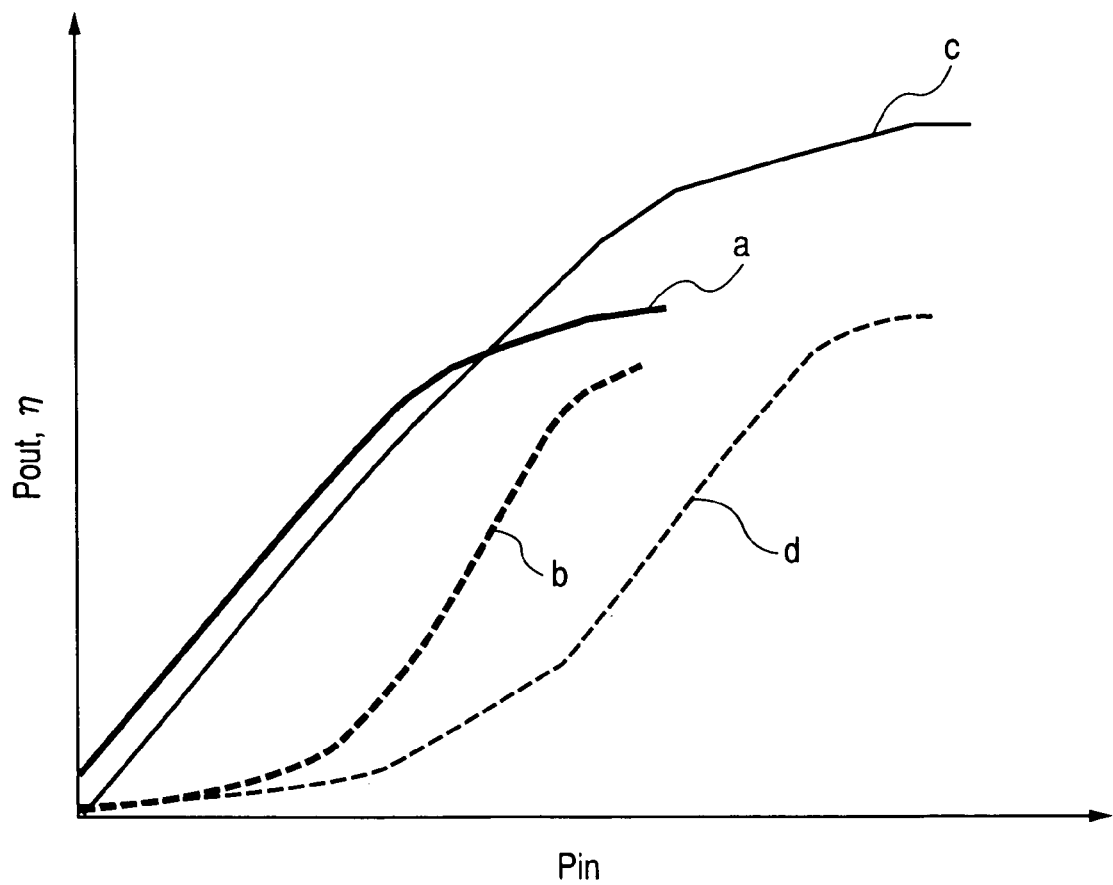
FIG. 7 is a chart showing input-output characteristics and efficiency characteristics of amplifier sections according to the present invention.

FIG. 7 shows input-output characteristics and efficiency characteristics of the low-power amplifier section and the high-power amplifier section. In FIG. 7, the horizontal axis represents an input power Pin, and the vertical axis represents an output power Pout and an efficiency η. Characteristic curves a and b represent an input-output characteristic and an efficiency characteristic, respectively, of the low-power amplifier section 110. Characteristic curves c and d represent an input-output characteristic and an efficiency characteristic, respectively, of the high-power amplifier section 109.

According to the level of an input power, switching between the high-power amplifier and the low-power amplifier is made through bias control for the two amplifiers, so that it is possible to use, when the input power level is low, the low-power amplifier section 110 whose efficiency characteristic b in a low power range is much better than the efficiency characteristic d of the high-power amplifier section 109 as shown in FIG. 7.

Embodiment 2

Figure 2:
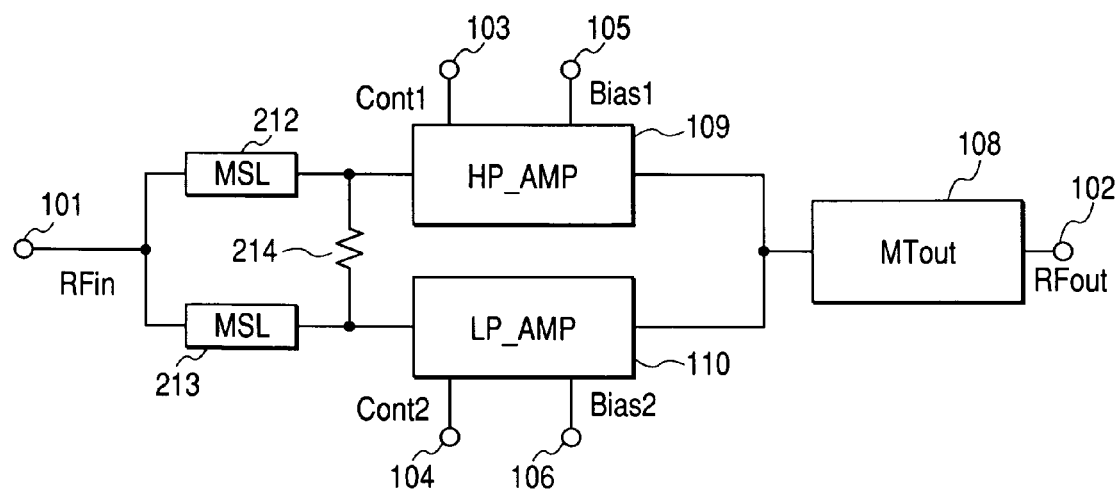
FIG. 2 is a circuit block diagram showing a configuration of a high-frequency power amplifier module according to a second embodiment of the present invention.

FIG. 2 is a circuit block diagram showing a configuration of a high-frequency power amplifier module according to a second embodiment of the present invention. The configuration is the same as the configuration shown in FIG. 1 with the high-isolation input matching circuit 107 replaced by a distributed constant Wilkinson circuit.

In this embodiment, distributed constant lines (MSLs) 212 and 213 and a resistance 214 make up the distributed constant Wilkinson circuit. In this case, it is not necessarily required that either or both of the line impedance and the electrical length are the same between the distributed constant lines 212 and 213. In other words, impedances and/or distributions at Wilkinson divider terminals may be different for the low-power amplifier section 110 and the high-power amplifier section 109.

This is because the amplification gain or the input impedance is not necessarily the same between the high-power amplifier section 109 and the low-power amplifier section 110. Unlike in a case where impedances and/or distributions are the same for the high-power and the low-power amplifier sections, in a case where they are different for the high-power and the low-power amplifier sections, a configuration incorporating an arrangement for matching the input impedances of the high-power amplifier section 109 and the low-power amplifier section 110 can be used. The latter case also has an advantage that the difference in gain between the two amplifier sections can be made up for. Generally, a permissible range of difference between distributions for two amplifier sections is, though being dependent on the system in use, generally in the range of $0 < \Delta G \leqq 10$ dB, or so.

When a distributed constant Wilkinson circuit is used, high isolation is maintained for not only fundamental-wave frequencies but also odd-numbered harmonics. A high-frequency power is input to the high-frequency input terminal 101 and is transmitted, via a distributed constant Wilkinson circuit, to the high-power amplifier section 109 or the low-power amplifier section 110. The subsequent operation is the same as in the configuration shown in FIG. 1. According to the configuration of this embodiment as with the configuration shown in FIG. 1, when the input power level is low, an efficiency characteristic much better than obtainable using the high-power amplifier section 109 can be obtained using the low-power amplifier section 110.

Embodiment 3

Figure 3:
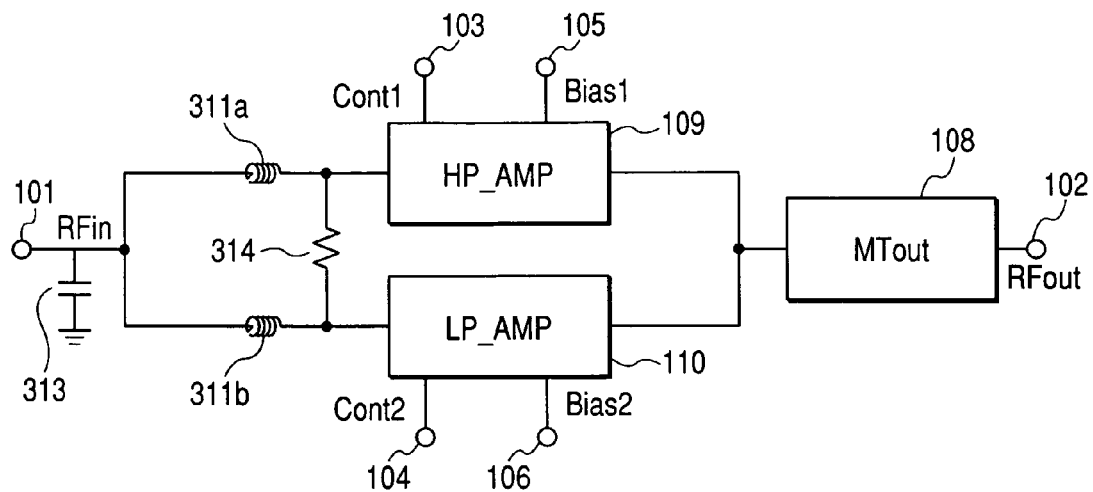
FIG. 3 is a circuit block diagram showing a configuration of a high-frequency power amplifier module according to a third embodiment of the present invention.

FIG. 3 is a circuit block diagram showing a configuration of a high-frequency power amplifier module according to a third embodiment of the present invention. The configuration is the same as the configuration shown in FIG. 1 with the high-isolation input matching circuit 107 replaced by a lumped constant Wilkinson circuit. In this embodiment, inductances 311a and 311b, a capacitance 313, and a resistance 314 make up the lumped constant Wilkinson circuit. In this case, the inductances 311a and 311b need not necessarily be of a same value. A high-frequency power is input to the high-frequency input terminal 101 and is transmitted, via the lumped constant Wilkinson circuit, to the high-power amplifier section 109 or the low-power amplifier section 110. The subsequent operation is the same as in the configuration shown in FIG. 1. The effects of this embodiment are also similar to those obtained from the configuration shown in FIG. 1.

Embodiment 4

Figure 4:
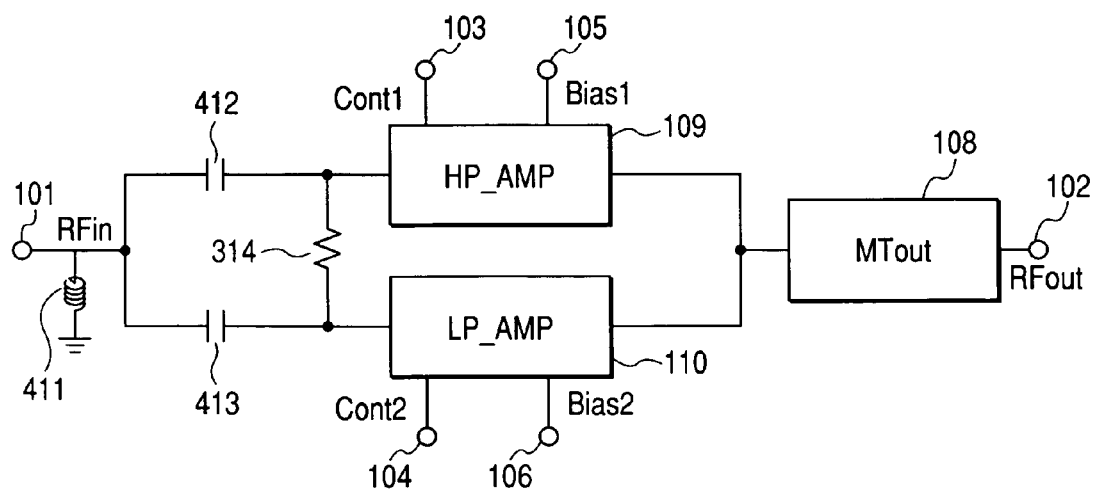
FIG. 4 is a circuit block diagram showing a configuration of a high-frequency power amplifier module according to a fourth embodiment of the present invention.

FIG. 4 is a circuit block diagram showing a configuration of a high-frequency power amplifier module according to a fourth embodiment of the present invention. The configuration is the same as the configuration shown in FIG. 1 with the high-isolation input matching circuit 107 replaced by a lumped constant Wilkinson circuit. In this embodiment, an inductance 411, capacitances 412 and 413, and a resistance 414 make up the lumped constant Wilkinson circuit. In this case, the capacitances 412 and 413 need not necessarily be of a same value. A high-frequency power is input to the high-frequency input terminal 101 and is transmitted, via the lumped constant Wilkinson circuit, to the high-power amplifier section 109 or the low-power amplifier section 110. The subsequent operation is the same as in the configuration shown in FIG. 1. The effects of this embodiment are also similar to those obtained from the configuration shown in FIG. 1.

Embodiment 5

Figure 5:
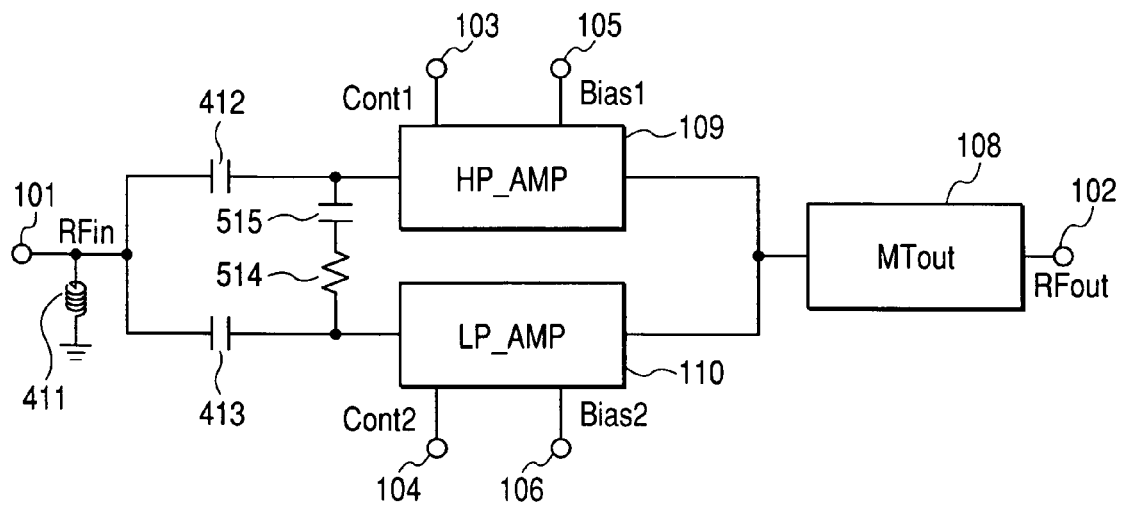
FIG. 5 is a circuit block diagram showing a configuration of a high-frequency power amplifier module according to a fifth embodiment of the present invention.

FIG. 5 is a circuit block diagram showing a configuration of a high-frequency power amplifier module according to a fifth embodiment of the present invention. The configuration is the same as the configuration shown in FIG. 4 with the lumped constant Wilkinson circuit made up of an inductance 411, capacitances 412, 413, and 515, and a resistance 514. The configuration of this embodiment has an advantage that, between the high-power amplifier section 109 and the low-power amplifier section 110, high isolation can also be maintained for direct currents and low frequencies dependent on the capacitance 515.

Embodiment 6

Figure 6:
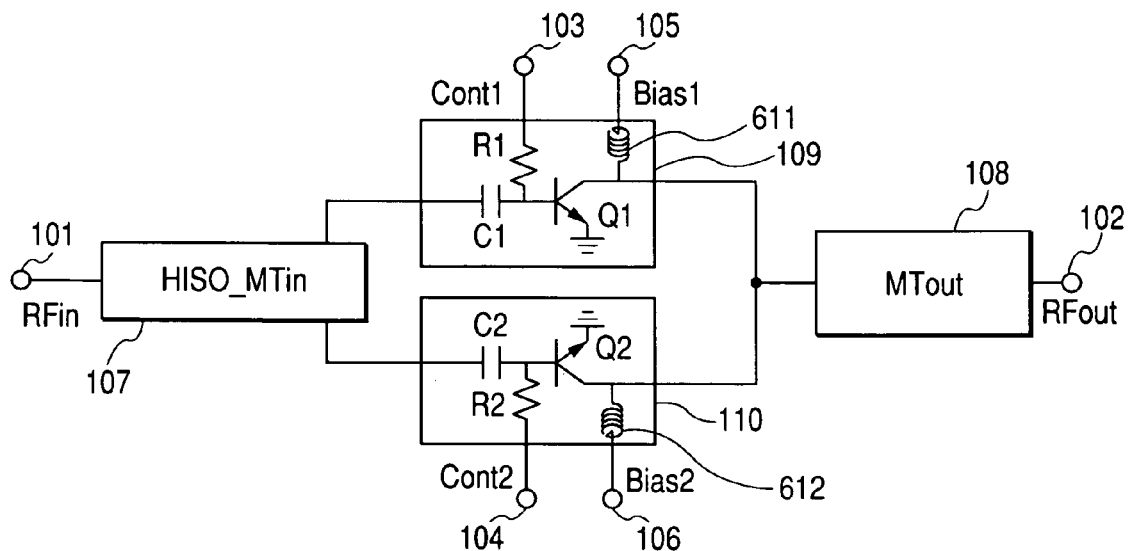
FIG. 6 is a circuit block diagram showing a configuration of a high-frequency power amplifier module according to a sixth embodiment of the present invention.

FIG. 6 is a circuit block diagram showing a configuration of a high-frequency power amplifier module according to a sixth embodiment of the present invention. The configuration is the same as the configuration shown in FIG. 1 with the high-power amplifier section 109 and the low-power amplifier section 110 each including a bipolar transistor. In the high-power amplifier section 109, the input side bias terminal 103 is connected, via a resistance R1, to the base of an emitter-grounded large-output transistor Q1 and the output side bias terminal 105 is connected, via an inductance 611, to the collector of the transistor Q1. Similarly, in the low-power amplifier section 110, the input side bias terminal 104 is connected, via a resistance R2, to the base of an emitter-grounded large-output transistor Q2 and the output side bias terminal 106 is connected, via an inductance 612, to the collector of the transistor Q2.

The bases of the transistors Q1 and Q2 are connected to an output of the high-isolation input matching circuit 107 via capacitors C1 and C2, respectively. The transistor Q1 included in the high-power amplifier section 109 has a device size equal to or larger than that of the transistor Q2 included in the low-power amplifier section 110.

Embodiment 7

Figure 8:
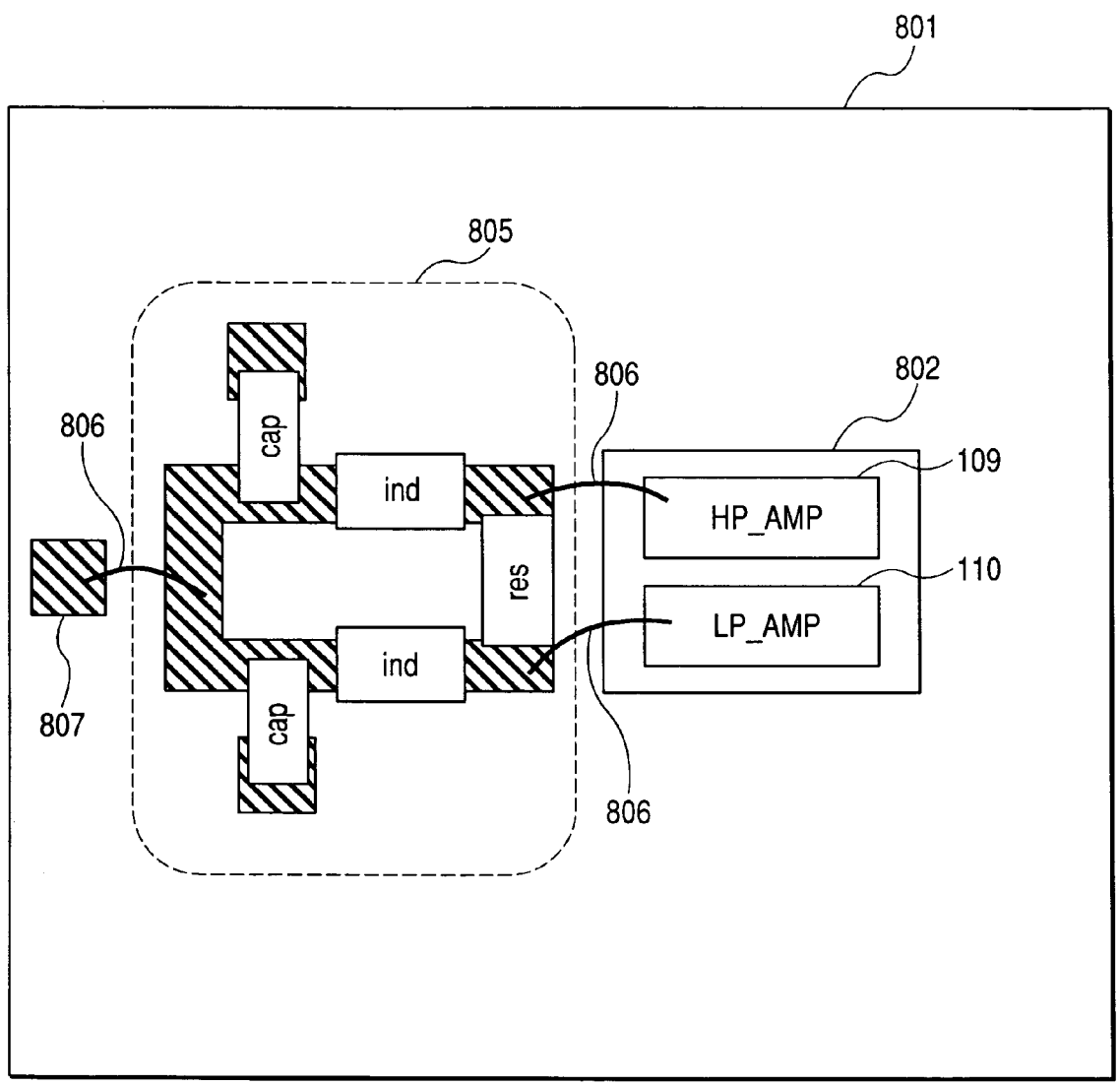
FIG. 8 is a circuit block diagram showing a configuration of a high-frequency power amplifier module according to a seventh embodiment of the present invention.

FIG. 8 is a circuit block diagram showing a configuration of a high-frequency power amplifier module according to a seventh embodiment of the present invention. The configuration is made up of an example module board 801 carrying a circuit pattern corresponding to the equivalent circuit shown in FIG. 3. Shaded areas of FIG. 8 represent wiring conductors on the module board. Also in FIG. 8, each "cap" represents a chip capacitor, each "ind" a chip inductor, a "res" a chip resistor, and each reference number 806 denotes a bonding wire. The components thus represented in FIG. 8 make up a lumped constant Wilkinson circuit 805. Note that FIG. 8 shows principal parts only. Such parts as an output matching circuit, output terminals, and bonding wires for output are not shown in FIG. 8. Such parts are also omitted in FIG. 9. The lumped constant Wilkinson circuit 805 can be configured for the circuits shown in FIG. 4 and FIG. 5, too.

A high-frequency power is input to a high-frequency input terminal 807 and is transmitted, via the lumped constant Wilkinson circuit 805, to the high-power amplifier section 109 or the low-power amplifier section 110 provided on a semiconductor chip 802. The subsequent operation is the same as in the configuration shown in FIG. 1.

Embodiment 8

Figure 9:
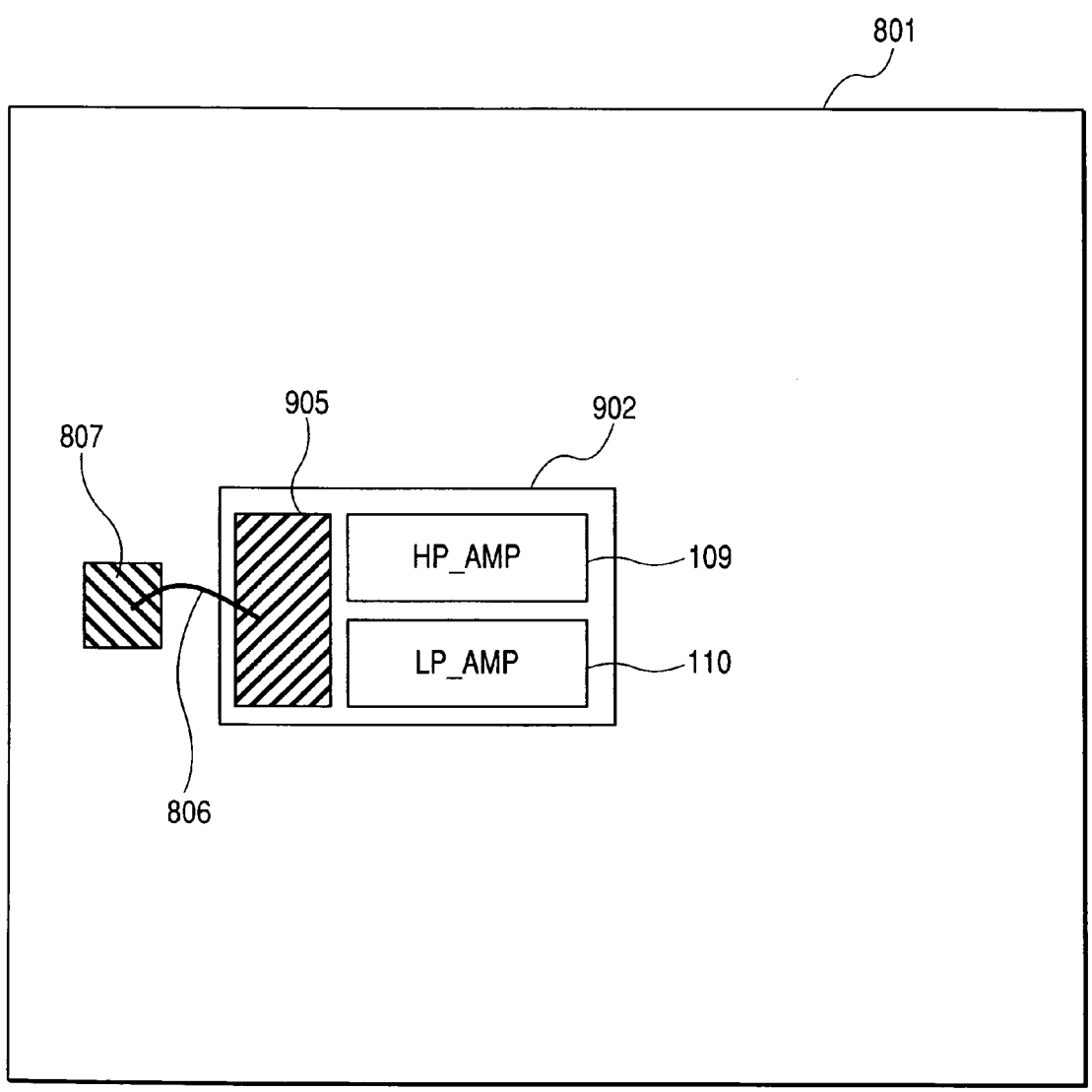
FIG. 9 is a circuit block diagram showing a configuration of a high-frequency power amplifier module according to an eighth embodiment of the present invention.

FIG. 9 is a circuit block diagram showing a configuration of a high-frequency power amplifier module according to an eighth embodiment of the present invention. The configuration is the same as the configuration shown in FIG. 8 with the lumped constant Wilkinson circuit 805 integrated on a semiconductor chip 902.

Use of an integrated high-isolation input matching circuit incorporating a lumped constant Wilkinson circuit realizes a smaller configuration than that shown in FIG. 8. The semiconductor chip 902 is mounted on the module board 801. The lumped constant Wilkinson circuit 905 can also be applied to the circuits shown in FIG. 4 and FIG. 5. A high-frequency power is input to a high-frequency input terminal 907 and is transmitted, via the lumped constant Wilkinson circuit 905, to the high-power amplifier section 109 or the low-power amplifier section 110 provided on the semiconductor chip 902. The subsequent operation is the same as in the configuration shown in FIG. 1.

The present invention has been described in connection with the preferred embodiments. The present invention, however, is not limited only to the above embodiments. It goes without saying that various design changes can be made without departing from the scope and spirit of the invention.

According to the present invention, wrapping around from the low-power amplifier section in an activated state to the high-power amplifier section in a deactivated state or from the high-power amplifier section in an activated state to the low-power amplifier section in a deactivated state can be reduced, so that a highly stable high-frequency power amplifier module can be provided.

What is claimed is:

1. A high-frequency power amplifier module comprising:
a first amplifier section which power amplifies a high-frequency signal;
a second amplifier section which power amplifies a high-frequency signal;
an input matching circuit which performs input matching between the first amplifier section and the second amplifier section; and
an output matching circuit which performs output matching between the first amplifier section and the second amplifier section,
wherein operations of the first amplifier section and the second amplifier section are switched to operate inversely of each other by control using a bias voltage or a bias current, wherein the input matching circuit has a high isolation characteristic between the first amplifier section and the second amplifier section, and wherein the input matching circuit is comprised of a Wilkinson divider.

2. The high-frequency power amplifier module according to claim 1, wherein the Wilkinson divider is comprised of a lumped constant circuit.

3. The high-frequency power amplifier module according to claim 1, wherein the Wilkinson divider is comprised of a distributed constant circuit.

4. The high-frequency power amplifier module according to claim 1, wherein impedances and distributions at divider terminals of the Wilkinson divider making up the input matching circuit differ for the first amplifier section and the second amplifier section.

5. The high-frequency power amplifier module according to claim 1, wherein impedances or distributions at divider terminals of the Wilkinson divider making up the input matching circuit differ for the first amplifier section and the second amplifier section.

6. A high-frequency power amplifier module comprising:
a first amplifier section which power amplifies a high-frequency signal;
a second amplifier section which power amplifies a high-frequency signal;
an input matching circuit which performs input matching between the first amplifier section and the second amplifier section; and
an output matching circuit which performs output matching between the first amplifier section and the second amplifier section,
wherein operations of the first amplifier section and the second amplifier section are switched to operate inversely of each other by control using a bias voltage or a bias current,
wherein the input matching circuit has a high isolation characteristic between the first amplifier section and the second amplifier section, and
wherein the first amplifier section is comprised of a high-power amplifier and the second amplifier section comprised of a low-power amplifier.

7. A high-frequency power amplifier module comprising:
a first amplifier section which power amplifies a high-frequency signal;
a second amplifier section which power amplifies a high-frequency signal;
an input matching circuit which performs input matching between the first amplifier section and the second amplifier section; and
an output matching circuit which performs output matching between the first amplifier section and the second amplifier section,
wherein operations of the first amplifier section and the second amplifier section are switched to operate inversely of each other by control using a bias voltage or a bias current,
wherein the input matching circuit has a high isolation characteristic between the first amplifier section and the second amplifier section, and
wherein impedances and distributions at divider terminals of the input matching circuit differ for the first amplifier section and the second amplifier section.

8. A high-frequency power amplifier module comprising:
a first amplifier section which power amplifies a high-frequency signal;
a second amplifier section which power amplifies a high-frequency signal;
an input matching circuit which performs input matching between the first amplifier section and the second amplifier section; and
an output matching circuit which performs output matching between the first amplifier section and the second amplifier section,
wherein operations of the first amplifier section and the second amplifier section are switched to operate inversely of each other by control using a bias voltage or a bias current,
wherein the input matching circuit has a high isolation characteristic between the first amplifier section and the second amplifier section, and
wherein impedances or distributions at divider terminals of the input matching circuit differ for the first amplifier section and the second amplifier section.

9. A high-frequency power amplifier module comprising:
a first amplifier section which power amplifies a high-frequency signal;
a second amplifier section which power amplifies a high-frequency signal;
an input matching circuit which performs input matching between the first amplifier section and the second amplifier section; and
an output matching circuit which performs output matching between the first amplifier section and the second amplifier section,
wherein the first amplifier section and the second amplifier section are switched to operate inversely of each other by using bias control,
wherein the input matching circuit has a high isolation characteristic between the first amplifier section and the second amplifier section, and
wherein the input matching circuit is comprised of a Wilkinson divider.

10. The high-frequency power amplifier module according to claim 9, wherein the Wilkinson divider is comprised of a lumped constant circuit.

11. The high-frequency power amplifier module according to claim 9, wherein the Wilkinson divider is comprised of a distributed constant circuit.

12. The high-frequency power amplifier module according to claim 9, wherein impedances and distributions at divider terminals of the Wilkinson divider making up the input matching circuit differ for the first amplifier section and the second amplifier section.

13. The high-frequency power amplifier module according to claim 9, wherein impedances or distributions at divider terminals of the Wilkinson divider making up the input matching circuit differ for the first amplifier section and the second amplifier section.

14. A high-frequency power amplifier module comprising:
a first amplifier section which power amplifies a high-frequency signal;
a second amplifier section which power amplifies a high-frequency signal;
an input matching circuit which performs input matching between the first amplifier section and the second amplifier section; and
an output matching circuit which performs output matching between the first amplifier section and the second amplifier section,
wherein the first amplifier section and the second amplifier section are switched to operate inversely of each other by using bias control, wherein the input matching circuit has a high isolation characteristic between the first amplifier section and the second amplifier section, and wherein the first amplifier section is comprised of a high-power amplifier and the second amplifier section comprised of a low-power amplifier.

15. A high-frequency power amplifier module comprising:

a first amplifier section which power amplifies a high-frequency signal;

a second amplifier section which power amplifies a high-frequency signal;

an input matching circuit which performs input matching between the first amplifier section and the second amplifier section; and an output matching circuit which performs output matching between the first amplifier section and the second amplifier section, wherein the first amplifier section and the second amplifier section are switched to operate inversely of each other by using bias control, wherein the input matching circuit has a high isolation characteristic between the first amplifier section and the second amplifier section, and wherein impedances and distributions at divider terminals of the input matching circuit differ for the first amplifier section and the second amplifier section.

16. A high-frequency power amplifier module comprising:

a first amplifier section which power amplifies a high-frequency signal;

a second amplifier section which power amplifies a high-frequency signal;

an input matching circuit which performs input matching between the first amplifier section and the second amplifier section; and an output matching circuit which performs output matching between the first amplifier section and the second amplifier section, wherein the first amplifier section and the second amplifier section are switched to operate inversely of each other by using bias control, wherein the input matching circuit has a high isolation characteristic between the first amplifier section and the second amplifier section, and wherein impedances or distributions at divider terminals of the input matching circuit differ for the first amplifier section and the second amplifier section.

* * * * *